United States Patent
Schmidt

(10) Patent No.: US 10,845,418 B2
(45) Date of Patent: Nov. 24, 2020

(54) METHOD AND DEVICE FOR OPERATING AN ENERGY STORAGE CELL, BATTERY MODULE, AND VEHICLE

(71) Applicant: Bayerische Motoren Werke Aktiengesellschaft, Munich (DE)

(72) Inventor: Jan Philipp Schmidt, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 252 days.

(21) Appl. No.: 16/183,282

(22) Filed: Nov. 7, 2018

(65) Prior Publication Data
US 2019/0072613 A1    Mar. 7, 2019

Related U.S. Application Data

(63) Continuation of application No. PCT/EP2017/058909, filed on Apr. 13, 2017.

(30) Foreign Application Priority Data

May 9, 2016    (DE) .......................... 10 2016 207 926

(51) Int. Cl.
   *G01R 31/36*    (2020.01)
   *G01R 31/38*    (2006.01)
   (Continued)

(52) U.S. Cl.
   CPC ....... *G01R 31/3835* (2019.01); *G01R 31/378* (2019.01); *G01R 31/382* (2019.01);
   (Continued)

(58) Field of Classification Search
   CPC .. G01R 31/36; G01R 31/364; G01R 31/3836; G01R 31/3842; G01R 31/378;
   (Continued)

(56) References Cited

U.S. PATENT DOCUMENTS

| | | |
|---|---|---|
| 5,862,515 A | 1/1999 | Kobayashi et al. |
| 2008/0208494 A1 | 8/2008 | Holz et al. |

(Continued)

FOREIGN PATENT DOCUMENTS

| | | |
|---|---|---|
| CA | 842216 A | 5/1970 |
| CN | 101194175 A | 6/2008 |

(Continued)

OTHER PUBLICATIONS

Chinese-language Office Action issued in Chinese Application No. 201780026667.0 dated Apr. 20, 2020 with English translation (15 pages).

(Continued)

*Primary Examiner* — Son T Le
(74) *Attorney, Agent, or Firm* — Crowell & Moring LLP

(57) ABSTRACT

A method and a device operate an energy storage cell having a cathode, an anode, an electrolyte, a first reference electrode which has a first capacity for storing an electric charge, and a second reference electrode which has a second capacity for storing an electric charge, the second capacity being larger than the first capacity. The method detects at least one electrode voltage between the one cathode or anode and the second reference electrode; determines the charge state of the energy storage cell using the at least one electrode voltage; detects a reference voltage between the second reference electrode and the first reference electrode; connects a current source to the first reference electrode and the second reference electrode such that the charge state of the first reference electrode and the second reference electrode changes; and separates the current source from the first reference electrode and the second reference electrode. The point in time when the current source is connected and separated to or from the first reference electrode and the second reference electrode depends on the result of a com- (Continued)

parison between the reference voltage and a specified voltage value.

15 Claims, 4 Drawing Sheets

(51) Int. Cl.
   *G01R 31/3835* (2019.01)
   *G01R 31/378* (2019.01)
   *G01R 31/382* (2019.01)
   *B60L 58/12* (2019.01)
   *B60L 50/64* (2019.01)
   *B60K 6/28* (2007.10)

(52) U.S. Cl.
   CPC ................ *B60K 6/28* (2013.01); *B60L 50/64* (2019.02); *B60L 58/12* (2019.02); *B60Y 2200/91* (2013.01); *B60Y 2200/92* (2013.01)

(58) Field of Classification Search
   CPC ..... G01R 31/382; G01R 31/387; B60L 58/12; B60L 50/64; B60K 6/28; B60Y 2200/91; B60Y 2200/92
   See application file for complete search history.

(56) References Cited

U.S. PATENT DOCUMENTS

| | | |
|---|---|---|
| 2009/0104510 A1 | 4/2009 | Fulop et al. |
| 2011/0250478 A1 | 10/2011 | Timmons et al. |
| 2013/0009604 A1 | 1/2013 | Bhardwaj et al. |
| 2013/0119940 A1* | 5/2013 | Iriyama .............. G01R 31/3835 320/134 |
| 2013/0252049 A1 | 9/2013 | Fleckenstein et al. |
| 2013/0314051 A1 | 11/2013 | Takezawa |
| 2014/0023888 A1* | 1/2014 | Fulop .................... H02J 7/0014 429/50 |
| 2014/0375325 A1* | 12/2014 | Wang ................ H01M 10/0431 324/426 |
| 2015/0064525 A1* | 3/2015 | Henrici ................ G01R 31/382 429/90 |
| 2015/0147614 A1 | 5/2015 | Wang et al. |
| 2015/0171398 A1 | 6/2015 | Roumi |
| 2015/0276884 A1 | 10/2015 | Andoh et al. |
| 2016/0006081 A1 | 1/2016 | Eaglesham et al. |
| 2019/0064275 A1* | 2/2019 | Han ..................... G01R 31/392 |

FOREIGN PATENT DOCUMENTS

| | | |
|---|---|---|
| CN | 101855773 A | 10/2010 |
| CN | 102214843 A | 10/2011 |
| CN | 103180701 A | 6/2013 |
| CN | 103283083 A | 9/2013 |
| EP | 2 442 400 A1 | 4/2012 |
| EP | 2 782 184 A1 | 9/2014 |
| WO | WO 2014/204479 A1 | 12/2014 |

OTHER PUBLICATIONS

International Search Report (PCT/ISA/210) issued in PCT Application No. PCT/EP2017/058909 dated Jul. 3, 2017 with English translation (six (6) pages).

German-language Written Opinion (PCT/ISA/237) issued in PCT Application No. PCT/EP2017/058909 dated Jul. 3, 2017 (seven (7) pages).

German-language Search Report issued in counterpart German Application No. 10 2016 207 926.3 dated Feb. 22, 2017 with partial English translation (18 pages).

\* cited by examiner

METHOD AND DEVICE FOR OPERATING AN ENERGY STORAGE CELL, BATTERY MODULE, AND VEHICLE

CROSS REFERENCE TO RELATED APPLICATIONS

This application is a continuation of PCT International Application No. PCT/EP2017/058909, filed Apr. 13, 2017, which claims priority under 35 U.S.C. § 119 from German Patent Application No. 10 2016 207 926.3, filed May 9, 2016, the entire disclosures of which are herein expressly incorporated by reference.

BACKGROUND AND SUMMARY OF THE INVENTION

The invention relates to a method and a device for operating an energy storage cell, a battery module and a vehicle.

Batteries for the storage of electrical energy play an important role in virtually every aspect of everyday life, for example in watches, in portable electrical appliances, and in the field of wireless telecommunications. Specifically, batteries are of key significance in the field of "electric mobility", both in vehicles having an electric drive only and in vehicles having a hybrid drive. The accurate determination of the operating state of batteries, for example their state of charge or service life, is of particular significance.

For the determination of the operating state of batteries, specifically the state of charge ("SOC") thereof, various methods are employed, for example a simple calibration of a measured voltage in relation to a known charging voltage curve, a direct measurement of the drain of charge by the integration of the flow of current already delivered, or a calibration of the integrated voltage using computer-assisted real-time calculations of in-service overvoltage potentials occurring in a battery model. Determination of the operating state can be improved by a measurement of the cathode or anode voltage in relation to a reference electrode. However, the potential of the reference electrode can change during the operation of the battery, as a result of which the measured cathode or anode voltage is invalidated.

The object of the present invention is the disclosure of a method and a device for operating an energy storage cell, a battery module and a vehicle, which permit the most reliable determination possible of the state of charge.

In the method according to the invention for operating an energy storage cell comprising at least one cathode, at least one anode, an electrolyte, at least one first reference electrode which has a first capacity for storing an electric charge, and at least one second reference electrode which has a second capacity for storing an electric charge, wherein the second capacity is greater than the first capacity, at least one electrode voltage is detected between the at least one cathode or anode and the second reference electrode, and the state of charge of the energy storage cell is determined on the basis of the at least one electrode voltage. Moreover, a reference voltage is detected between the second reference electrode and the first reference electrode, and a current source or a current sink are connected to the first reference electrode and the second reference electrode, such that the state of charge of the first reference electrode and the second reference electrode varies, whereafter the current source or the current sink are then separated from the first reference electrode and the second reference electrode. The time of connection and separation of the current source or current sink to or from the first reference electrode and the second reference electrode is thus dependent upon the result of a comparison of the reference voltage with at least one specified voltage value.

The device according to the invention for operating an energy storage cell, which comprises at least one cathode, at least one anode, an electrolyte, at least one first reference electrode which has a first capacity for storing an electric charge, and at least one second reference electrode which has a second capacity for storing an electric charge, wherein the second capacity is greater than the first capacity, incorporates at least one current source or at least one current sink, which is designed to charge or discharge the first and second reference electrodes. A control apparatus is further provided, which is configured to determine the state of charge of the energy storage cell on the basis of at least one electrode voltage between the at least one cathode or anode and the second reference electrode, and to connect the current source or the current sink to the first reference electrode and the second reference electrode, such that the state of charge of the first reference electrode and the second reference electrode changes, and the current source or the current sink is then separated from the first reference electrode and the second reference electrode, wherein the time of connection and separation of the current source or current sink to or from the first reference electrode and the second reference electrode is dependent upon the result of a comparison of the reference voltage with at least one specified voltage value.

The battery module according to the invention comprises one or more devices according to the invention.

The vehicle according to the invention, specifically a motor vehicle, comprises an electric drive or a hybrid drive, and at least one battery module according to the invention.

The invention is based upon the approach whereby a first and second reference electrode are provided, having different capacities for storing an electric charge, wherein the capacity of the second reference electrode is greater than the capacity of the first reference electrode. By the measurement of a reference voltage between the second reference electrode, having a greater capacity, in relation to the first reference electrode, having a lower capacity, any drift in the potential of the second reference electrode during the operation of the cell can be monitored. As the capacity of the second reference electrode is greater than the capacity of the first reference electrode, the state of charge of the first reference electrode during the operation of the energy storage cell changes more rapidly than the state of charge of the second reference electrode such that, correspondingly, the potential of the first reference electrode varies more rapidly than that of the second reference electrode. If the measured reference voltage is positive, this indicates that the potential of the first reference electrode is smaller than the potential of the second reference electrode, or that the potential of the first reference electrode has dropped in relation to the potential of the second reference electrode. Correspondingly, it can be concluded from a negative reference voltage that the potential of the first reference electrode is greater than the potential of the second reference electrode, or that the potential of the first reference electrode has risen, relatively to the potential of the second reference electrode.

During the operation of the energy storage cell, i.e. specifically during the release of the electric charges stored in the anode or cathode, the state of charge of the first and second reference electrode can also change. Depending upon the material of the reference electrodes, as a result of small leakage currents which specifically occur during the measurement of the reference voltage between the second reference electrode and the first reference electrode, charges are released or taken up by the first and second reference electrodes.

If the first and second reference electrodes are discharged during the operation of the energy storage cell, from a reference voltage which rises to a first specified, and particularly a positive voltage value, or exceeds the latter, not only the complete, or near-complete discharging of the first reference electrode, but also an impending complete or near-complete discharging of the second reference electrode, and thus an associated impending drop in the potential of the second reference electrode, can be inferred.

Conversely, if the first and second reference electrodes are charged during the operation of the energy storage cell, from a reference voltage which drops to at least a third specified, and particularly a negative voltage value, or undershoots the latter, not only the complete or near-complete charging of the first reference electrode, but also an impending complete or near-complete charging of the second reference electrode, and thus an associated impending rise in the potential of the second reference electrode, can be inferred.

In order to prevent a drop or rise of this type, i.e. a relatively large variation in the potential of the second reference electrode, the state of charge of the first and second reference electrodes, by means of connection to a current source or a current sink, i.e. the application of a charging current or a load, undergoes recharging or discharging. Active charging of this type is executed until such time as the reference voltage achieves or undershoots a second specified, and particularly a negative voltage value, whereas, conversely, active discharging of this type is executed until such time as the reference voltage achieves or exceeds a fourth specified, and particularly a positive voltage value.

Accordingly, a complete or near-complete charging or discharging of the second reference electrode during the operation of the energy storage cell can be reliably prevented, such that the potential of the second reference electrode remains essentially constant.

Overall, the invention ensures that the second reference electrode maintains an essentially constant potential such that, by reference to the electrode voltage between the cathode or the anode on the one hand, and to the second reference electrode on the other hand, the state of charge of the energy storage cell can be reliably determined during any phase of operation of the cell.

The employment of a first and second reference electrode, specifically having the same chemical composition and of different capacities, further permits the monitoring of the function or state of the reference electrodes themselves given that, from the reference voltage, e.g. a conductor failure on one of the two electrodes, a short-circuit on the anode or cathode, or on other non-isolated parts, or chemical changes in one of the two reference electrodes can be identified.

Preferably, the first reference electrode and/or the second reference electrode are formed of a material, the potential characteristic of which incorporates a plateau, specifically a pronounced plateau. As a result, by the detection of a reference voltage between the second reference electrode and the first reference electrode, the variation in the potential of the second reference electrode can be controlled and/or monitored in a particularly reliable manner, or the electrode voltage detected between the second reference electrode and the cathode or anode can be employed for the determination of the operating state of the energy storage cell in a particularly reliable manner.

Moreover, the first reference electrode and the second reference electrode are preferably constituted of the same material, such that the reference voltage between the second reference electrode and the first reference electrode, if neither of the two reference electrodes is fully or nearly fully charged or discharged, is essentially equal to 0 volts.

Within the meaning of the present invention, the "discharging" of a reference electrode signifies a release of charge carriers, for example ions, by the reference electrode. Correspondingly, within the meaning of the invention, the "charging" or "recharging" of a reference electrode signifies the take-up of charge carriers, for example ions, by the reference electrode. Within the meaning of the invention, a "capacity" of a reference electrode signifies the (charge) quantity, specifically of ions, which can be taken up by the reference electrode when it is inserted in the electrolytes.

In a preferred embodiment, a current source is connected to the first reference electrode and to the second reference electrode, such that the first reference electrode and the second reference electrode are charged if the reference voltage exceeds a first specified voltage value. The current source is again separated from the first reference electrode and the second reference electrode, if the reference voltage is lower than a second specified voltage value. The current source can be configured as a voltage source, for example as a battery. It is specifically preferred that the current source is the energy storage cell itself, i.e. that power tapped-off from the cathode and the anode is employed for the charging of the first and second reference electrodes. A complete or near-complete discharging of the second reference electrode is reliably prevented accordingly.

In a further preferred embodiment, a current sink is connected to the first reference electrode and the second reference electrode, such that the first reference electrode and the second reference electrode are discharged, if the reference voltage is lower than a third specified voltage value. The current sink is again separated from the first reference electrode and the second reference electrode, if the reference voltage exceeds a fourth specified voltage value. The current sink can be configured as a load which converts power, for example as a resistor or as a battery to be charged. It is specifically preferred that the quantity of charge tapped-off from the first and second reference electrodes is employed for the charging of the energy storage cell. A complete or near-complete charging of the second reference electrode is reliably prevented accordingly.

In a further preferred embodiment, the at least one specified voltage value, specifically the first and/or second and/or third and/or fourth specified voltage value, is approximately 0 volts. This is particularly advantageous if the first reference electrode and the second reference electrode are comprised of the same material, and the potential characteristics thereof respectively incorporate a pronounced plateau such that, provided that no complete or near-complete discharging of the first reference electrode occurs, the reference voltage essentially remains at approximately 0 volts. Accordingly, in a particularly reliable manner, the second reference electrode can be operated in a state in which the operating state of the energy storage cell can be reliably determined.

In a further preferred embodiment, the first specified voltage value is positive and the second specified voltage value is negative. It is thus ensured that the current source, in the event of an impending complete or near-complete discharging of the first reference electrode, is reliably connected to both reference electrodes. Advantageously, by the selection of the first and second specified voltage values, the operating range of the first and second reference electrodes can be expanded, and specifically adjusted to the potential characteristic of the potential of the first and second reference electrodes.

In a further preferred embodiment, the third specified voltage value is negative, and the fourth specified voltage value is positive. It is thus ensured that the current sink, in the event of an impending complete or near-complete charging of the first reference electrode, is reliably connected to both reference electrodes. Advantageously, by the selection of the third and fourth specified voltage values, the operating range of the first and second reference electrodes can be expanded, and specifically adjusted to the potential characteristic of the potential of the first and second reference electrodes.

Preferably, the method for operating an energy storage cell is repeated after the separation of the current source or the current sink from the first reference electrode and the second reference electrode. Specifically, moreover, the reference voltage between the second reference electrode and the first reference electrode is further detected, and the electrode voltage between the at least one cathode or anode and the second reference electrode is employed for the determination of the state of charge of the energy storage cell, until the reference voltage at least exceeds or undershoots a specified voltage value. It is thus reliably ensured that the potential of the second reference electrode, during the operation of the energy storage cell, remains constant, such that the operating state of the energy storage cell can be accurately determined.

In a further preferred embodiment of the method, at the start of the operation of the energy storage cell and/or prior to the execution of the above-mentioned steps of said method, the reference electrodes are firstly brought to a specific potential. To this end, depending upon the state of charge of the reference electrodes, the current source or the current sink is connected to the first reference electrode and the second reference electrode, such that the first reference electrode and the second reference electrode are charged or discharged. Moreover, the reference voltage between the second reference electrode and the first reference electrode is detected, whereafter the current source or the current sink is once more separated from the first reference electrode, wherein the time of separation is dependent upon the result of a comparison of the reference voltage with at least one specified voltage value. The current source or the current sink is not separated from the second reference electrode until a specified time interval has elapsed, further to the separation of the current source or the current sink from the first reference electrode.

Preferably, the current source is separated from the first reference electrode, if the reference voltage between the second reference electrode and the first reference electrode drops to the specified second voltage value, or undershoots the latter.

Preferably, the current sink is separated from the first reference electrode, if the reference voltage between the second reference electrode and the first reference electrode rises to the specified fourth voltage value, or exceeds the latter.

As a result, the current source or current sink is preferably separated from the first reference electrode at a time at which the potential of the first reference electrode begins to rise or drop, or the first reference electrode is fully or nearly fully charged or discharged. Specifically, the current source or current sink is preferably separated from the first reference electrode at a time at which the potential of the first reference electrode no longer lies in the region of a plateau in the potential characteristic of the first reference electrode.

In the event of the charging of the first and second reference electrodes at the start of operation of the energy storage cell, an additional quantity of charge is deposited on the second reference electrode such that, in the subsequent operation of the cell, it is ensured that, in the event of the simultaneous discharging of the first and second reference electrodes, specifically as a result of leakage currents associated with the detection of the reference voltage, the first reference electrode is fully or nearly fully discharged prior to the second reference electrode whereas, conversely, the second reference electrode is still maintained at a specified potential at this time. It is thus ensured that the potential of the second reference electrode, at the time at which the reference voltage between the second reference electrode and the first reference electrode is specifically greater than the specified first voltage value, does not drop, or drops only slightly. As a result, specifically, an essentially constant potential is maintained on the second reference electrode during the operation of the energy storage cell.

In the event of the discharging of the first and second reference electrodes at the start of operation of the energy storage cell, an additional quantity of charge is removed from the second reference electrode such that, in the subsequent operation of the cell, it is ensured that, in the event of the simultaneous charging of the first and second reference electrodes, specifically as a result of leakage currents associated with the detection of the reference voltage, the first reference electrode is fully or nearly fully charged prior to the second reference electrode whereas, conversely, the second reference electrode is still maintained at a specified potential at this time. It is thus ensured that the potential of the second reference electrode, at the time at which the reference voltage between the second reference electrode and the first reference electrode is specifically lower than the specified third voltage value, does not drop, or drops only slightly. As a result, specifically, an essentially constant potential is maintained on the second reference electrode during the operation of the energy storage cell.

In a further preferred embodiment of the method, the specified time interval is selected in accordance with the difference, specifically the ratio and/or the margin between the second capacity of the second reference electrode and the first capacity of the first reference electrode. The specified time interval is preferably selected such that the reference voltage between the second reference electrode and the first reference electrode, even in the event of the continuous charging or discharging of the second reference electrode, throughout the specified time interval, remains lower than the specified second voltage value and greater than the specified fourth voltage value. It is further preferred that the specified time interval is selected such that a quantity of charge is deposited on the second reference electrode or is removed from the second reference electrode, in order to ensure that, in the event of the uniform discharging or charging of the first reference electrode and the second reference electrode, specifically as a result of a leakage current associated with the detection of a reference voltage during the operation of the energy storage cell, the first reference electrode is fully, or nearly fully discharged or charged prior to the second reference electrode. This ensures, in a particularly reliable manner, that the potential of the second reference electrode remains essentially constant during the operation of the energy storage cell, and permits the accurate determination of the operating state of the energy storage cell.

In a further preferred embodiment of the method, the first reference electrode comprises a first surface and the second reference electrode comprises a second surface, wherein the second surface is larger than the first surface. It is thus achieved, in a simple manner, that the second capacity of the second reference electrode is greater than the first capacity of the first reference electrode. Thus, by the measurement of the reference voltage between the second reference electrode and the first reference electrode, the state of charge of the first reference electrode can be inferred and—by the subsequent charging or discharging of both reference electrodes—any discharging or charging of the second reference electrode to a point at which the potential of the second reference electrode would likewise commence to drop or rise can be avoided. As a result, during the operation of the energy storage cell, an essentially constant potential can be maintained on the second reference electrode in a particularly reliable manner.

In a further preferred embodiment of the method, the second surface is approximately three times the size of the first surface. It is thus reliably ensured that, by the charging or discharging of the second reference electrode for the specified time interval with effect from the time of separation of the current source or current sink from the first reference electrode, a particularly large additional quantity of charge can be deposited on the second reference electrode or removed from the second reference electrode such that, in the event of the uniform discharging or charging of the first reference electrode and the second reference electrode, specifically as a result of leakage currents associated with the operation of the energy storage cell, the first reference electrode is fully, or nearly fully discharged or charged by a particularly significant margin in advance of the second reference electrode, as can be reliably detected on the basis of the reference voltage. By the subsequent charging or discharging of both reference electrodes, any further discharging or charging of the second reference electrode to a point at which the potential of the second reference electrode would likewise commence to drop or rise can be avoided. Overall, as a result, during the operation of the energy storage cell, an essentially constant potential can be maintained on the second reference electrode in a particularly reliable manner.

In a further embodiment of the method, the first reference electrode and/or the second reference electrode is configured as a lithium-iron phosphate electrode (LFP-electrode), a lithium-cobalt oxide electrode (LCO-electrode) or a lithium titanate electrode (LTO-electrode). By the employment of these materials, it is achieved that the first reference electrode or the second reference electrode are each characterized by a plateau at an essentially constant potential, which only shows a transition to significantly larger or smaller values in the event of complete, or near-complete charging or discharging. It is thus achieved that the reference voltage detected between the second reference electrode and the first reference electrode during the operation of the energy storage cell remains essentially constant over a prolonged time period, i.e. at different states of charge. Consequently, the second reference electrode, provided that no significant change in the reference voltage is recorded, can be reliably employed for the detection of at least one electrode voltage between the at least one cathode or anode and the second reference electrode.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
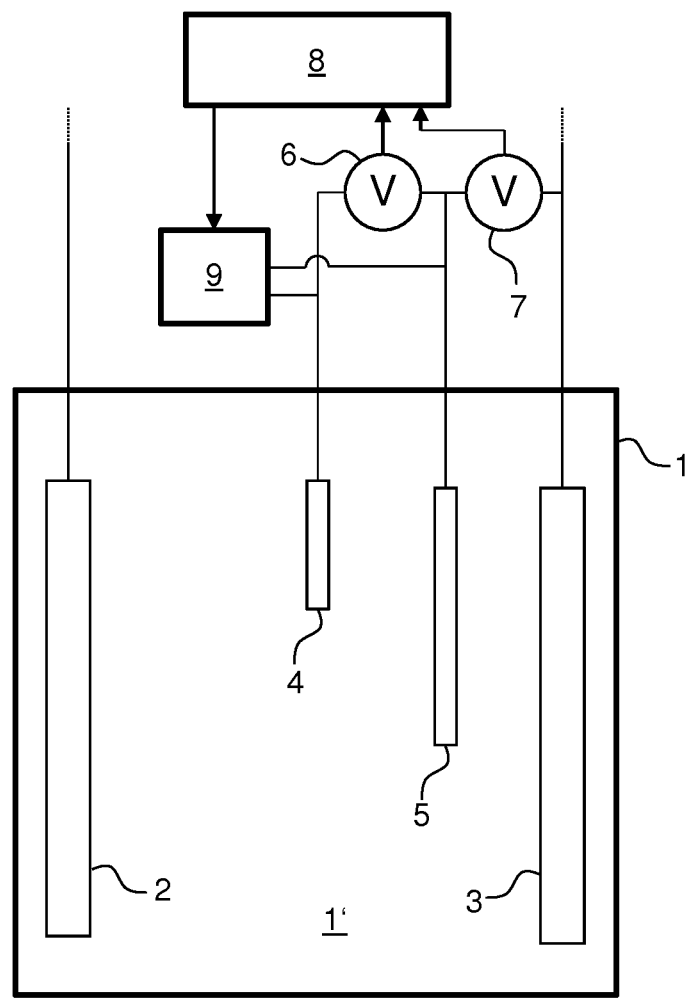
FIG. 1 is a cross-sectional representation of an exemplary energy storage cell, having a first and a second reference electrode.

FIG. 1 shows a schematic cross-sectional representation of an exemplary energy storage cell 1 having a cathode 2, an anode 3, a first reference electrode 4 and a second reference electrode 5, wherein the area, i.e. the surface of the second reference electrode 5 is greater than the area of the first reference electrode 4. The cathode 2, the anode 3, and the first and second reference electrodes 4 or 5 are enclosed by an electrolyte 1'.

Between the first reference electrode 4 and the second reference electrode 5, a first voltage measuring unit 6 is arranged, which determines a potential difference in the form of a reference voltage between the second reference electrode 5 and the first reference electrode 4.

Additionally, between the second reference electrode 5 and the anode 3, a second voltage measuring unit 7 is arranged, which determines a potential difference in the form of an electrode voltage between the anode 3 and the second reference electrode 5. On the basis of the electrode voltage, the operating state of the energy storage cell 1, specifically the state of charge of the anode 3, can be determined in a processing unit 8. Alternatively or additionally, the second voltage measuring unit 7 can be provided for the detection of an electrode voltage between the second reference electrode 5 and the cathode 4, on the basis of which the operating state of the energy storage cell 1, specifically the state of charge of the cathode 2, can be determined in the processing unit 8.

The processing unit 8 is further designed to actuate a current source 9 and/or to interconnect said current source 9 with the first reference electrode 4 and the second reference electrode 5, such that the latter are charged by the current source 9. In place of the current source 9, a current sink (not represented) can also be provided, wherein the processing unit 8 is correspondingly designed to actuate the current sink and/or to interconnect said current sink with the first reference electrode 4 and the second reference electrode 5, such that the latter are discharged via the current sink.

The determination of the operating state of the energy storage cell 1 by the processing unit 8 is preferably executed in consideration of the reference voltage. On the basis of the reference voltage, the processing unit 8 specifically determines whether the electrode voltage can be employed for the reliable determination of the state of charge of the energy storage cell 1. Accordingly, the operating state can be reliably determined with reference to the electrode voltage between the anode 3 and the second reference electrode 5, provided that e.g. the reference voltage is lower than, or essentially equal to a specified voltage value, specifically 0 volts.

Preferably, the first and second reference electrodes 4 or 5, prior to the start of the actual operation of the energy storage cell 1, are brought to a specified potential and/or a specified state of charge, wherein the latter undergo a charging process, in which e.g. lithium ions are removed from the respective reference electrodes 4 or 5. Alternatively, however, it is also possible for the first and second electrodes 4 or 5 to undergo a discharging process, in which e.g. lithium ions are deposited in the reference electrodes.

Figure 2A:
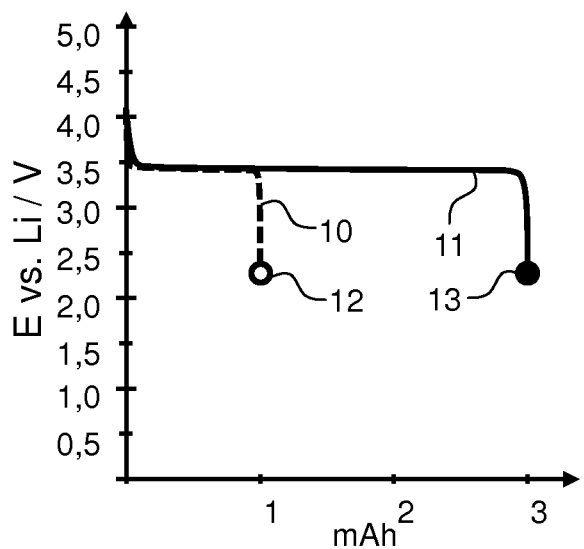
FIGS. 2A-2C show exemplary characteristics for the potentials of the first and second reference electrodes during the charging of the first and second reference electrodes.
Figure 2B:
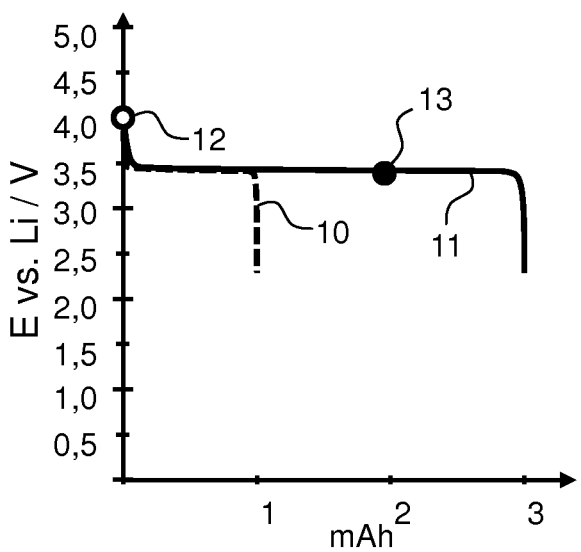
Figure 2C:
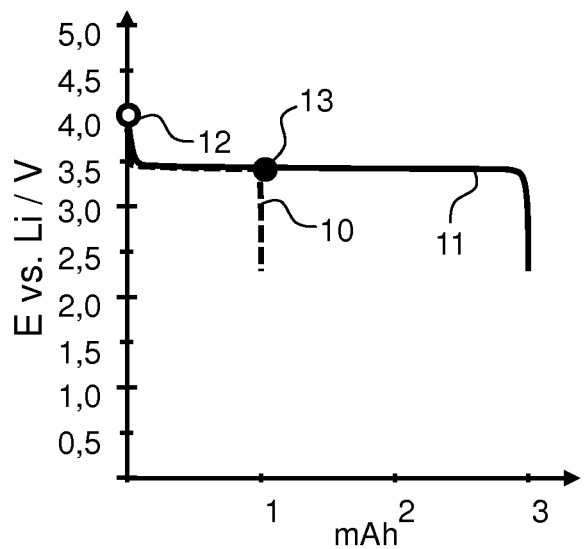

FIGS. 2A to 2C show exemplary characteristics for the potentials of the first and second reference electrodes 4 or 5 during a charging process of the first reference electrode 4 and the second reference electrode 5, wherein the potential of the first reference electrode 4 (the broken line 10) and of the second electrode 5 (the solid line 11) with respect to lithium are plotted on the y-axis, and the respective quantity of charge delivered is plotted on the x-axis.

In the selected manner of representation, the respective state of charge of the first or the second reference electrode is represented by a first state of charge indicator 12 or by a second state of charge indicator 13, the respective value of which, on the x-axis, indicates the quantity of charge which has already been delivered by the respective reference electrode, and the value of which, on the y-axis, indicates the associated potential.

In the example represented here, both the reference electrodes are comprised of lithium-iron phosphate (LFP), such that the potentials of both reference electrodes, in the fully-charged and in the fully-discharged state, assume the same value, namely, approximately 4 volts or approximately 2.3 volts, and show a pronounced plateau in the intermediate zone. In the present example, the second reference electrode 5 has a capacity which is approximately three times that of the first reference electrode 4, and can thus take up a quantity of charge which is approximately three times as great or, with an equal quantity of charge output, can be operated for three times as long, until the potential drops to approximately 2.3 volts.

As can be seen from FIG. 2A, at the start of the charging process, the first reference electrode 4 and the second reference electrode 5 are uncharged, and assume a potential of approximately 2.3 volts, illustrated in the figure by the first state of charge indicator 12 and the second state of charge indicator 13. The reference voltage between the second reference electrode 5 and the first reference electrode 2 is 0 volts.

During the charging process, an equal quantity of charge is initially delivered to the first reference electrode 4 and the second reference electrode 5, specifically by way of connection to a current source 9. In the phase represented in FIG. 2B, the first reference electrode 4, further to the infeed of approximately 1 mAh, is fully charged. The potential of the first reference electrode 4, as indicated by the first state of charge indicator 12, is approximately 4 volts. As a result of the approximately three times greater capacity of the second reference electrode 5, the 1 mAh quantity of charge infed has raised the potential of the second reference electrode 5 to approximately 3.5 volts, which thus lies within the region of the pronounced plateau, as can be seen from the second state of charge indicator 13. In this phase, the reference voltage between the second reference electrode 5 and the first reference electrode 4 is therefore of the order of −0.5 volts. The processing unit 8, on the basis of this reference voltage, which is higher than a specified voltage value, for example 0 volts, can detect that the first reference electrode 4 is fully charged, or nearly fully charged, and that the second reference electrode 5 is charged to approximately one third.

Once this has been established, the second reference electrode 5 continues to be charged for a further specified time interval. In the example represented in FIG. 2C, the specified time interval approximately corresponds to the time interval which was required for the full charging of the first reference electrode 4. A further quantity of charge of the order of 1 mAh is thus infed to the second reference electrode 5 such that, ultimately, the latter is two-thirds charged. In the example represented, the charging process ends at this point. At the end of the charging process, the first reference electrode 4 can therefore deliver a maximum quantity of charge of 1 mAh before it is fully discharged, whereas, conversely, the second reference electrode 4 can deliver almost double this quantity of charge, of the order of 2 mAh, before the latter in turn is fully discharged. This feature is exploited during the operation of the energy storage cell 1, in order to maintain a constant potential on the second reference electrode 5 at all times, and thus permit a reliable determination of the anode or cathode potential relative to the second reference electrode 5, as described in greater detail hereinafter.

Figure 3A:
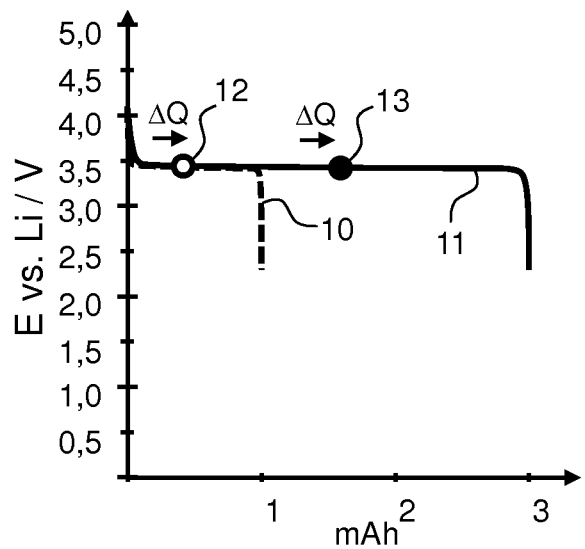
FIGS. 3A-3B show exemplary characteristics for the potentials of the first and second reference electrodes during the operation of the energy storage cell.
Figure 3B:
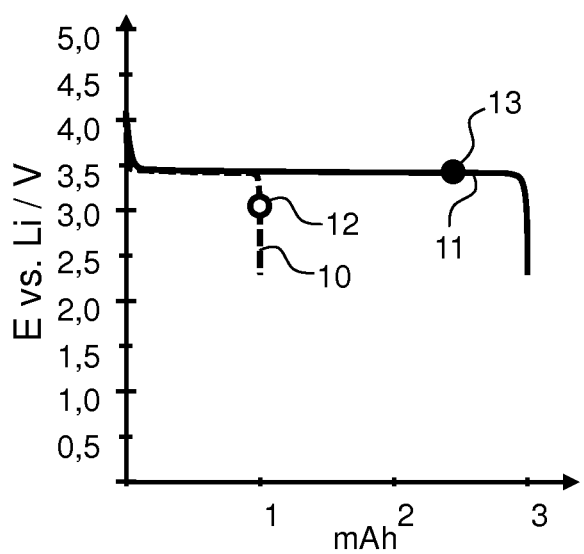

FIGS. 3A and 3B show exemplary characteristics for the potentials of the first and second reference electrodes during the operation of the energy storage cell 1. During operation, the first reference electrode 4 and the second reference electrode 5, as a result of leakage currents, which specifically occur in conjunction with the measurement of the reference voltage, are gradually discharged. In FIG. 3A, the first and second reference electrodes, from their original state at the end of the charging process described with reference to FIG. 2, have delivered a respective quantity of charge of $\Delta Q \approx 0.5$ mAh. The state of charge indicators are correspondingly displaced to the first reference electrode potential 10 and the second reference electrode potential 11, as represented by the arrows thus plotted. Consequently, the first state of charge indicator 12 now lies within the plateau of the first reference electrode potential 10. The reference voltage between the second reference electrode 5 and the first reference electrode 4 is thus approximately 0 volts.

If the two reference electrodes are discharged further, the potential of the first reference electrode 4, as shown in FIG. 3B, falls below the potential of the second reference electrode 5, as the capacity of the second reference electrode 5 is preferably approximately three times greater than the capacity of the first reference electrode 4, and the second reference electrode 5, at the start of the discharging process, was two-thirds charged. The reference voltage between the second reference electrode 5 and the first reference electrode 4 is approximately 0.5 volts. The potential of the second reference electrode 5 progresses to the state of charge indicated by the second state of charge indicator 13 in an essentially constant manner, and can therefore be reliably employed for the determination of the electrode voltage between the anode 3 and the second reference electrode 5, and for the determination of the operating state of the energy storage cell 1 from the electrode voltage.

Preferably, on the basis of the declining reference voltage, the processing unit 8 detects that the first reference electrode 4 is fully, or nearly fully discharged, and that the discharging of the second reference electrode 5, or a drop in the second reference electrode potential 11, is impending. Specifically, an impending drop in the second reference electrode potential 11 can be detected on the grounds that the reference voltage is greater than the specified voltage value, e.g. 0 volts.

If the first reference electrode is fully, or nearly fully discharged, the first reference electrode 4 and the second reference electrode 5 are recharged by the connection thereof to the current source 9, wherein an approximately equal quantity of charge is infed to each reference electrode. Preferably, the first reference electrode is fully recharged, and the second reference electrode is two-thirds recharged, as already described with reference to FIG. 2, such that the reference voltage at the end of the recharging process is restored to approximately −0.5 volts, and the reliable determination of the electrode voltage or of the state of charge of the energy storage cell 1 continues to be possible during the further operation of the energy storage cell 1.

The processing unit 8 is preferably configured such that the operating state of the energy storage cell 1 is determined with reference to the electrode voltage, provided that the reference voltage is lower than a specified first voltage value, for example 0.25 volts. If the reference voltage rises, as a result of the discharging of the first and second reference electrodes associated with leakage currents which occur during the measurement of the reference voltage, to 0.25 volts or higher, by the actuation of the processing unit 8, the current source 9 is connected to both reference electrodes, and a respective quantity of charge of approximately 1 mAh is infed to the first reference electrode 4 and the second reference electrode 5. The current source 9 is again separated by the processing unit 8 from the two reference electrodes if the reference voltage falls to a specified second voltage value, for example −0.25 volts, or lower.

Alternatively, the first reference electrode 4 and the second reference electrode 5, during the operation of the energy storage cell 1, as a result of leakage currents associated with the measurement of the reference voltage, can also be charged. This is detected by the processing unit 8 on the basis of a drop in the reference voltage to a specified third voltage value, for example −0.25 volts, or lower, in response to which a current sink (not represented) is connected to the two reference electrodes, such that charge is evacuated from the reference electrodes. If the reference voltage rises thereafter to a specified fourth voltage value, for example 0.25 volts, or higher, the processing unit 8 again separates the current sink from the two reference electrodes.

For the second reference electrode 5 and/or the first reference electrode 4, materials are preferably employed which incorporate an extended plateau in their potential characteristic, such as, for example, lithium-iron phosphate (LFP).

Figure 4:
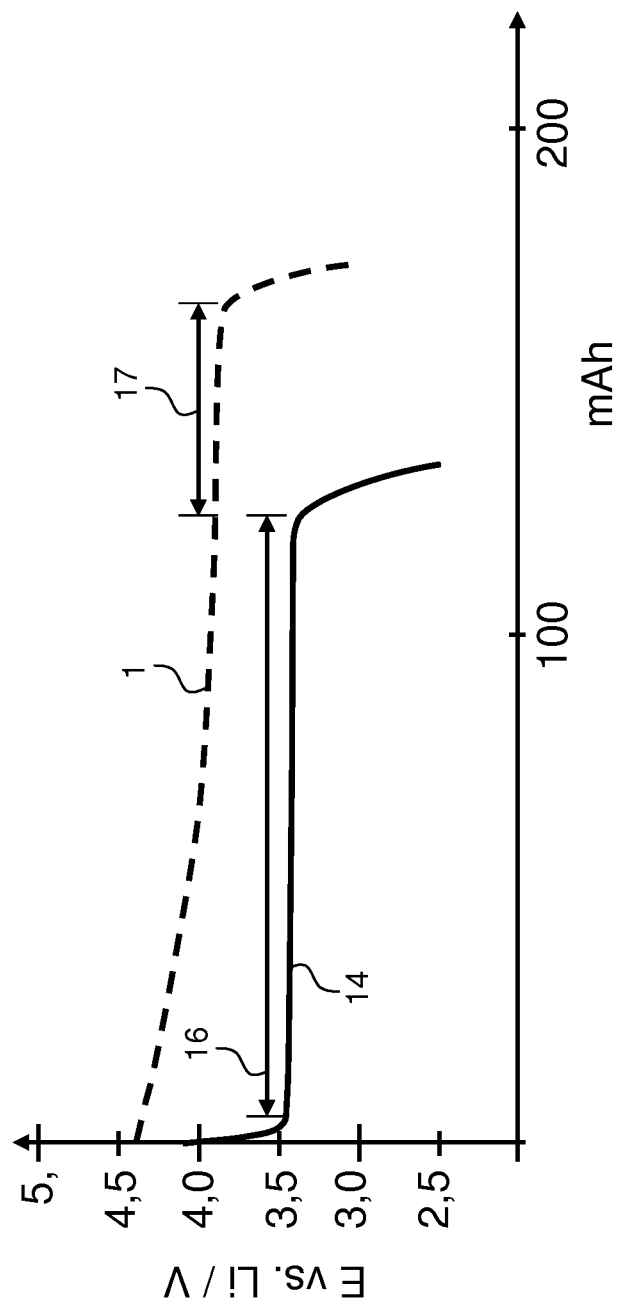
FIG. 4 shows exemplary potential characteristics of reference electrodes of different materials.

FIG. 4 represents exemplary potential characteristics for a reference electrode of lithium-iron phosphate (LFP) 14 (solid line) and a reference electrode of lithium-cobalt oxide (LCO) 15 (broken line), with respect to lithium, according to the state of charge, i.e. the respective quantity of charge delivered. A first double-headed arrow 16 indicates the plateau region of the LFP reference electrode 14, and a second double-headed arrow 17 indicates the plateau region of the LCO reference electrode 15. In the region of these plateaux, on the grounds of the essentially constant reference potential, these reference electrodes are particularly effective for the determination of an electrode voltage with respect to the cathode 2 or the anode 3, and correspondingly for the determination of the state of charge of the energy storage cell 1. The same applies, correspondingly, to reference electrodes of lithium titanate (LTO).

LIST OF REFERENCE NUMBERS

1 Energy storage cell
2 Cathode
3 Anode
4 First reference electrode
5 Second reference electrode
6 First voltage measuring unit
7 Second voltage measuring unit
8 Processing unit
9 Current source
10 Potential characteristic of the first reference electrode
11 Potential characteristic of the second reference electrode
12 First state of charge indicator
13 Second state of charge indicator
14 Potential characteristic for a reference electrode of lithium-iron phosphate (LFP)
15 Potential characteristic for a reference electrode of lithium-cobalt oxide (LCO)
16 Plateau for a reference electrode of lithium-iron phosphate (LFP)
17 Plateau for a reference electrode of lithium-cobalt oxide (LCO)

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for operating an energy storage cell comprising at least one cathode, at least one anode, an electrolyte, at least one first reference electrode which has a first capacity for storing an electric charge, and at least one second reference electrode which has a second capacity for storing an electric charge, wherein the second capacity is greater than the first capacity, wherein the method comprises the steps of:
   a) detecting at least one electrode voltage between the at least one cathode or anode and the second reference electrode;
   b) determining a state of charge of the energy storage cell on the basis of the at least one electrode voltage;
   c) detecting a reference voltage between the second reference electrode and the first reference electrode;
   d) connecting a current source or a current sink to the first reference electrode and the second reference electrode, such that the state of charge of the first reference electrode and the second reference electrode varies, and separating the current source or the current sink from the first reference electrode and the second reference electrode, wherein
   the time of connection and separation of the current source or the current sink to or from the first reference electrode and the second reference electrode is dependent upon the result of a comparison of the reference voltage with at least one specified voltage value.

2. The method as claimed in claim 1 wherein
   in step d), the voltage source is connected to the first reference electrode and the second reference electrode, such that the first reference electrode and the second reference electrode are charged, if the reference voltage exceeds a first specified voltage value, and the current source is again separated from the first reference electrode and the second reference electrode, if the reference voltage is lower than a second specified voltage value.

3. The method as claimed in claim 1 wherein
in step d), the current sink is connected to the first reference electrode and the second reference electrode, such that the first reference electrode and the second reference electrode are discharged, if the reference voltage is lower than a third specified voltage value, and the current source is again separated from the first reference electrode and the second reference electrode, if the reference voltage exceeds a fourth specified voltage value.

4. The method as claimed in claim 3, wherein
at least one of the specified voltage values is approximately 0 volts.

5. The method as claimed in claim 2, wherein
the first specified voltage value is positive, and the second specified voltage value is negative.

6. The method as claimed in claim 3, wherein
the third specified voltage value is negative, and the fourth specified voltage value is positive.

7. The method as claimed in claim 1, wherein, prior to steps a) to d), the method comprises the steps of:
connecting the current source or the current sink to the first reference electrode and the second reference electrode, such that the first reference electrode and the second reference electrode are charged or discharged;
detecting the reference voltage between the second reference electrode and the first reference electrode;
separating the current source or current sink from the first reference electrode, wherein the time of separation is dependent upon the result of a comparison of the reference voltage with at least one specified voltage value; and
separating the current source or current sink from the second reference electrode, once a specified time interval has elapsed further to the separation of the current source or current sink from the first reference electrode.

8. The method as claimed in claim 7, wherein
the specified time interval is selected in accordance with a comparison between the second capacity of the second reference electrode and the first capacity of the first reference electrode.

9. The method as claimed in claim 8, wherein
the comparison is a ratio or a margin.

10. The method as claimed in claim 1, wherein
the first reference electrode comprises a first surface and the second reference electrode comprises a second surface, and
the second surface is larger than the first surface.

11. The method as claimed in claim 10, wherein
the second surface is approximately three times the size of the first surface.

12. The method as claimed in claim 1, wherein one or both of:
the first reference electrode and the second reference electrode is configured as a lithium-iron phosphate electrode, a lithium-cobalt oxide electrode or a lithium titanate electrode.

13. A device for operating an energy storage cell comprising at least one cathode, at least one anode, an electrolyte, at least one first reference electrode which has a first capacity for storing an electric charge, and at least one second reference electrode which has a second capacity for storing an electric charge, wherein the second capacity is greater than the first capacity, the device comprising:
at least one current source or at least one current sink, which is configured to charge or discharge the first and second reference electrodes;
a control apparatus, which is configured to determine a state of charge of the energy storage cell on the basis of at least one electrode voltage between the at least one cathode or anode and the second reference electrode, and to connect the current source or the current sink to the first reference electrode and the second reference electrode, such that the state of charge of the first reference electrode and the second reference electrode changes, and again to separate the current source or the current sink from the first reference electrode and the second reference electrode, wherein
the time of connection and separation of the current source or current sink to or from the first reference electrode and the second reference electrode is dependent upon the result of a comparison of the reference voltage with at least one specified voltage value.

14. A battery module, comprising one or more devices as claimed in claim 13.

15. A motor vehicle, comprising an electric drive or a hybrid drive, and a battery module as claimed in claim 14.

* * * * *